(12) United States Patent
Chen et al.

(10) Patent No.: US 11,652,317 B2
(45) Date of Patent: May 16, 2023

(54) ELECTRICAL CONNECTOR ASSEMBLY

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Joe-Fu Chen, Irvine, CA (US); Terrance F. Little, Fullerton, CA (US)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 304 days.

(21) Appl. No.: 17/146,444

(22) Filed: Jan. 11, 2021

(65) Prior Publication Data
US 2021/0218183 A1    Jul. 15, 2021

Related U.S. Application Data

(60) Provisional application No. 62/959,886, filed on Jan. 11, 2020.

(51) Int. Cl.
| | | |
|---|---|---|
| *H01R 13/62* | (2006.01) | |
| *H05K 5/00* | (2006.01) | |
| *H01R 12/72* | (2011.01) | |

(52) U.S. Cl.
CPC ....... *H01R 13/6205* (2013.01); *H05K 5/0069* (2013.01); *H01R 12/722* (2013.01); *H05K 5/0086* (2013.01)

(58) Field of Classification Search
CPC ............ H01R 13/6205; H01R 13/6594; H01R 12/722; H05K 5/0069; H05K 5/0086
See application file for complete search history.

(56) References Cited

U.S. PATENT DOCUMENTS

| | | | | |
|---|---|---|---|---|
| 5,096,436 A | * | 3/1992 | Noschese | H01R 13/6275 439/352 |
| 6,811,427 B2 | * | 11/2004 | Garrett | H01R 13/6456 439/378 |
| 7,445,452 B1 | * | 11/2008 | Wu | H01R 13/6205 439/39 |
| 8,113,870 B2 | * | 2/2012 | Su | H01R 13/5816 439/455 |
| 8,770,986 B2 | * | 7/2014 | Furness | H01R 13/6205 439/906 |
| 8,790,120 B2 | * | 7/2014 | Wang | H01R 13/6205 439/700 |

(Continued)

FOREIGN PATENT DOCUMENTS

CN        2831479 Y      10/2006

*Primary Examiner* — Thanh Tam T Le
(74) *Attorney, Agent, or Firm* — Ming Chieh Chang

(57) ABSTRACT

An electrical connector assembly includes a receptacle connector disposed in a wearable machine and equipped with one row contacts and a set of magnets, and a cable connector equipped with two rows of contacts and another set of magnets so as to be mated with the receptacle connector in a flippable manner wherein the interface between the receptacle connector and the cable connector is of a stadium configuration, and the set of magnets are located at two opposite halves of the long sides of the stadium configuration in the diagonal direction.

18 Claims, 20 Drawing Sheets

(56) References Cited

U.S. PATENT DOCUMENTS

| | | | |
|---|---|---|---|
| 9,017,092 B1 | 4/2015 | McCracken et al. | |
| 9,065,205 B2 * | 6/2015 | Gao | H01R 13/6592 |
| 9,147,965 B2 * | 9/2015 | Lee | H01R 13/6205 |
| 9,196,979 B2 * | 11/2015 | Kim | H01R 13/64 |
| 10,074,947 B2 * | 9/2018 | Tsai | H01R 27/00 |
| 10,312,646 B2 * | 6/2019 | Little | H01R 13/6581 |
| 10,374,341 B1 * | 8/2019 | Phillips | H01R 12/722 |
| 10,396,494 B2 * | 8/2019 | Little | H01R 12/7023 |
| 10,511,127 B2 | 12/2019 | Chang | |
| 10,622,767 B2 * | 4/2020 | Wu | H01R 13/6658 |
| 10,658,793 B2 * | 5/2020 | Blake | G06F 1/18 |
| 10,879,634 B1 * | 12/2020 | Liao | H01R 13/6587 |
| 11,171,445 B1 * | 11/2021 | Shen | H01R 13/502 |
| 11,271,337 B2 * | 3/2022 | Huang | H01R 12/7052 |

\* cited by examiner

ELECTRICAL CONNECTOR ASSEMBLY

BACKGROUND OF THE INVENTION

1. Field of the Invention

The present invention relates generally to an electrical connector assembly for use within a wearable device.

2. Description of Related Arts

U.S. Pat. No. 9,685,744 discloses a wearable device enclosing a printed circuit board with two connectors at two opposite ends for connecting two electrical parts. Even though the connector has a good waterproof performance, the connection operation is desired to be more convenient.

SUMMARY OF THE INVENTION

An electrical connector assembly includes a receptacle connector disposed in a wearable machine and equipped with one row contacts and a set of magnets, and a cable connector equipped with two rows of contacts and another set of magnets so as to be mated with the receptacle connector in a flippable manner wherein the interface between the receptacle connector and the cable connector is of a stadium configuration, and the set of magnets are located at two opposite halves of the long sides of the stadium configuration in the diagonal direction.

DETAILED DESCRIPTION OF THE PREFERRED EMBODIMENT

Figure 1:
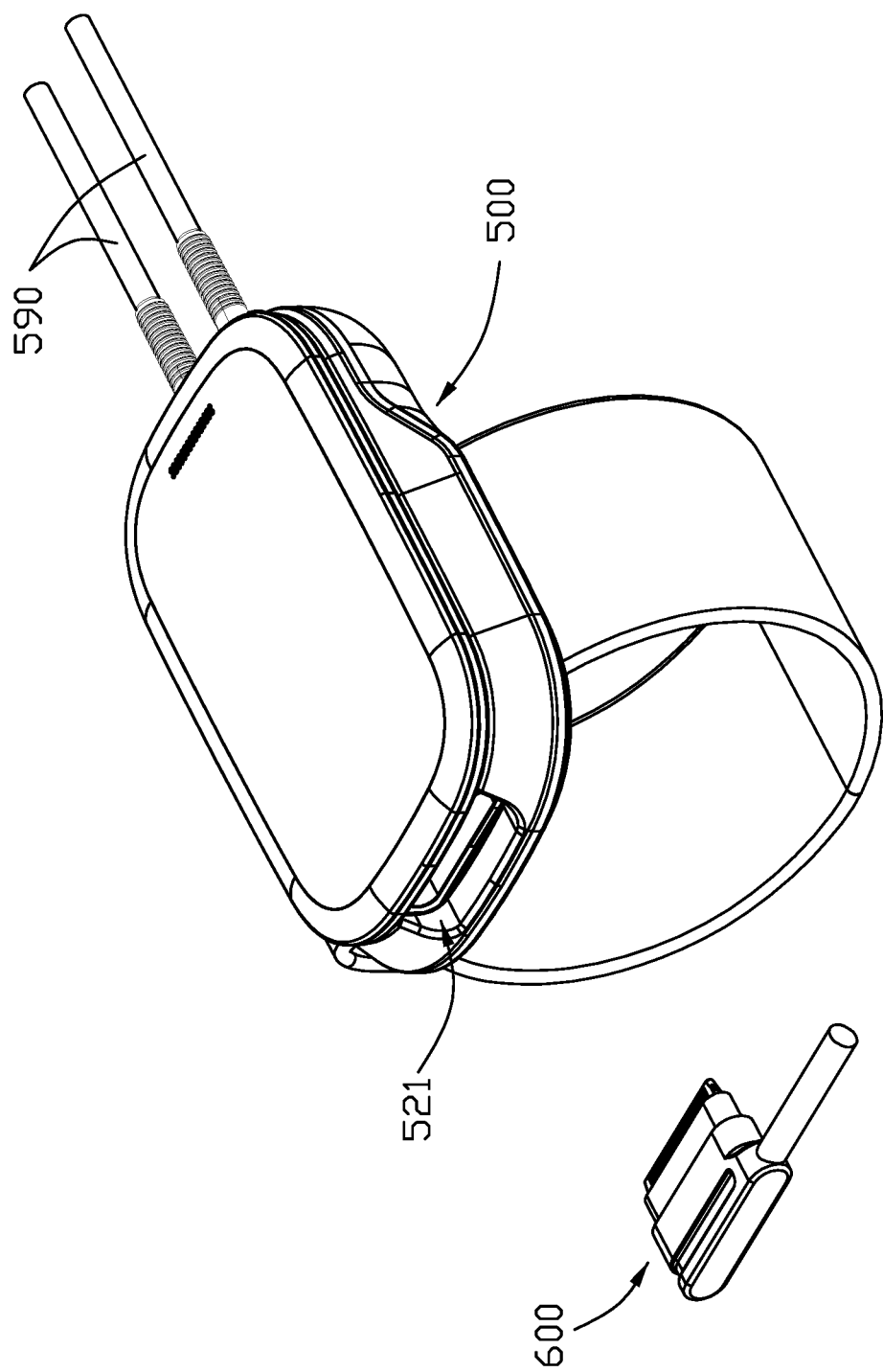
FIG. 1 is a perspective view of an electrical assembly including a wearable device and a cable connector detached therefrom according to a third embodiment of the invention.
Figure 2:
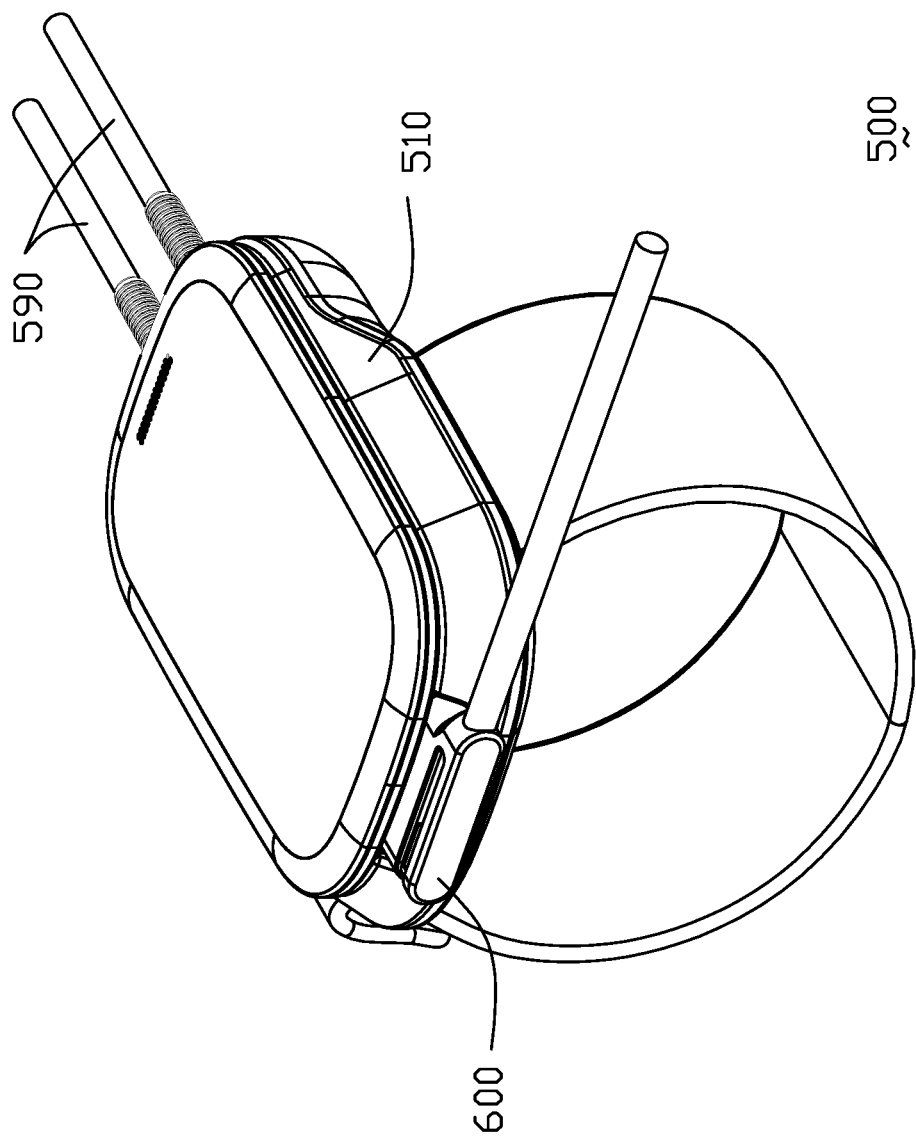
FIG. 2 is a perspective view of the electrical assembly of FIG. 1 wherein the cable connector is mated with the wearable device in one orientation.
Figure 3:
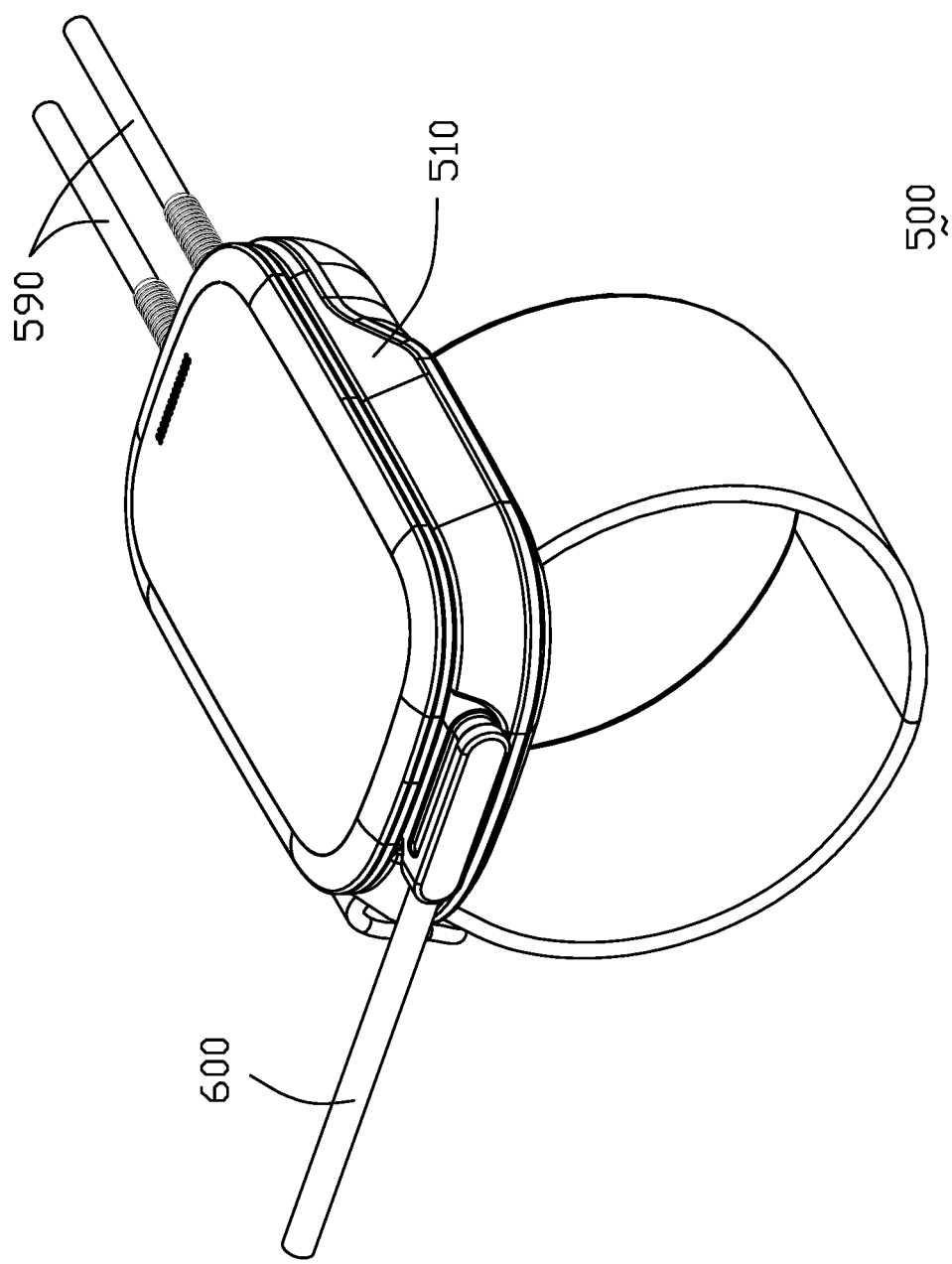
FIG. 3 is another perspective view of the electrical assembly of FIG. 1 wherein the cable connector si mated with the wearable device in another orientation.
Figure 4:
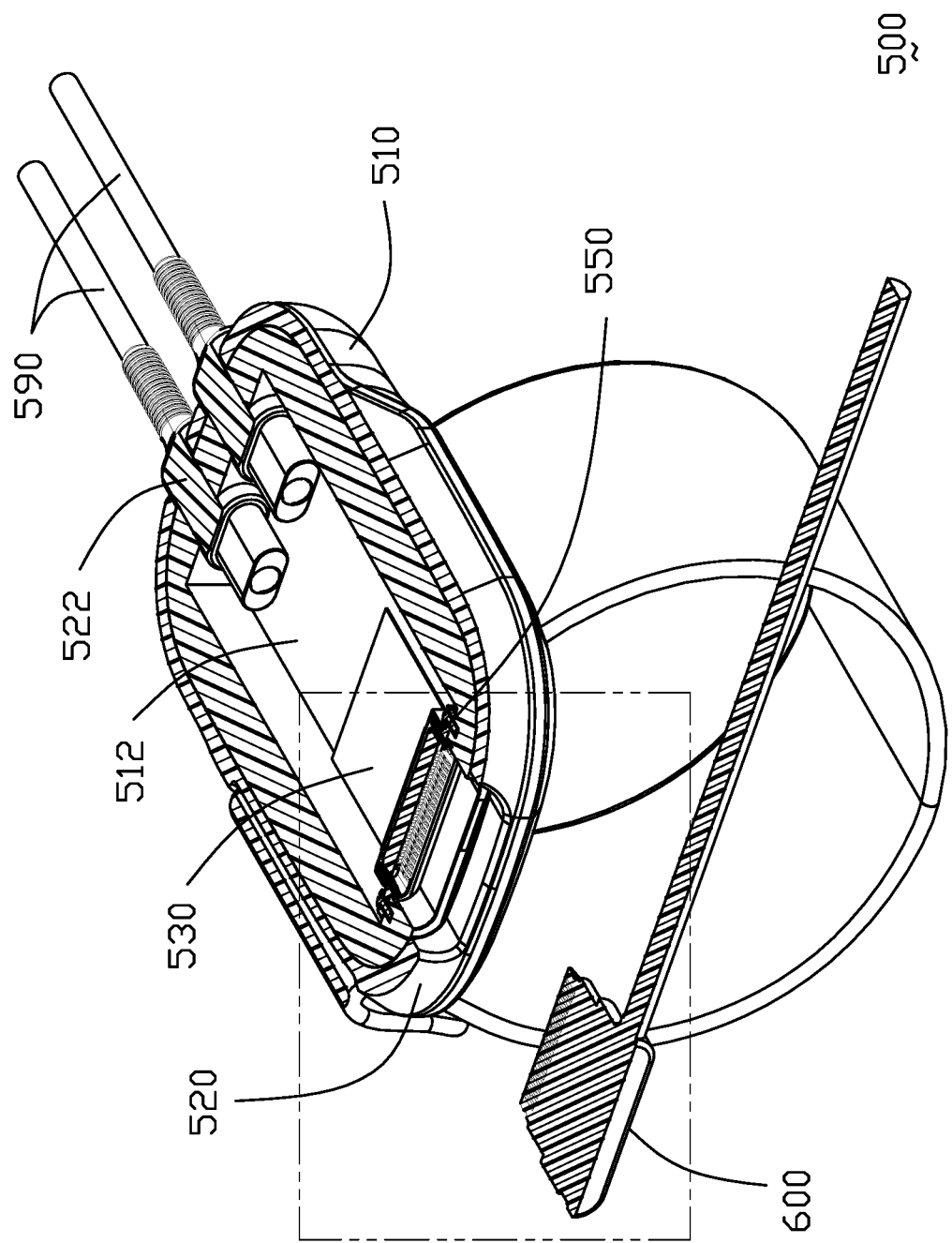
FIG. 4 is a cross-sectional perspective view of the electrical assembly of FIG. 1.
Figure 5:
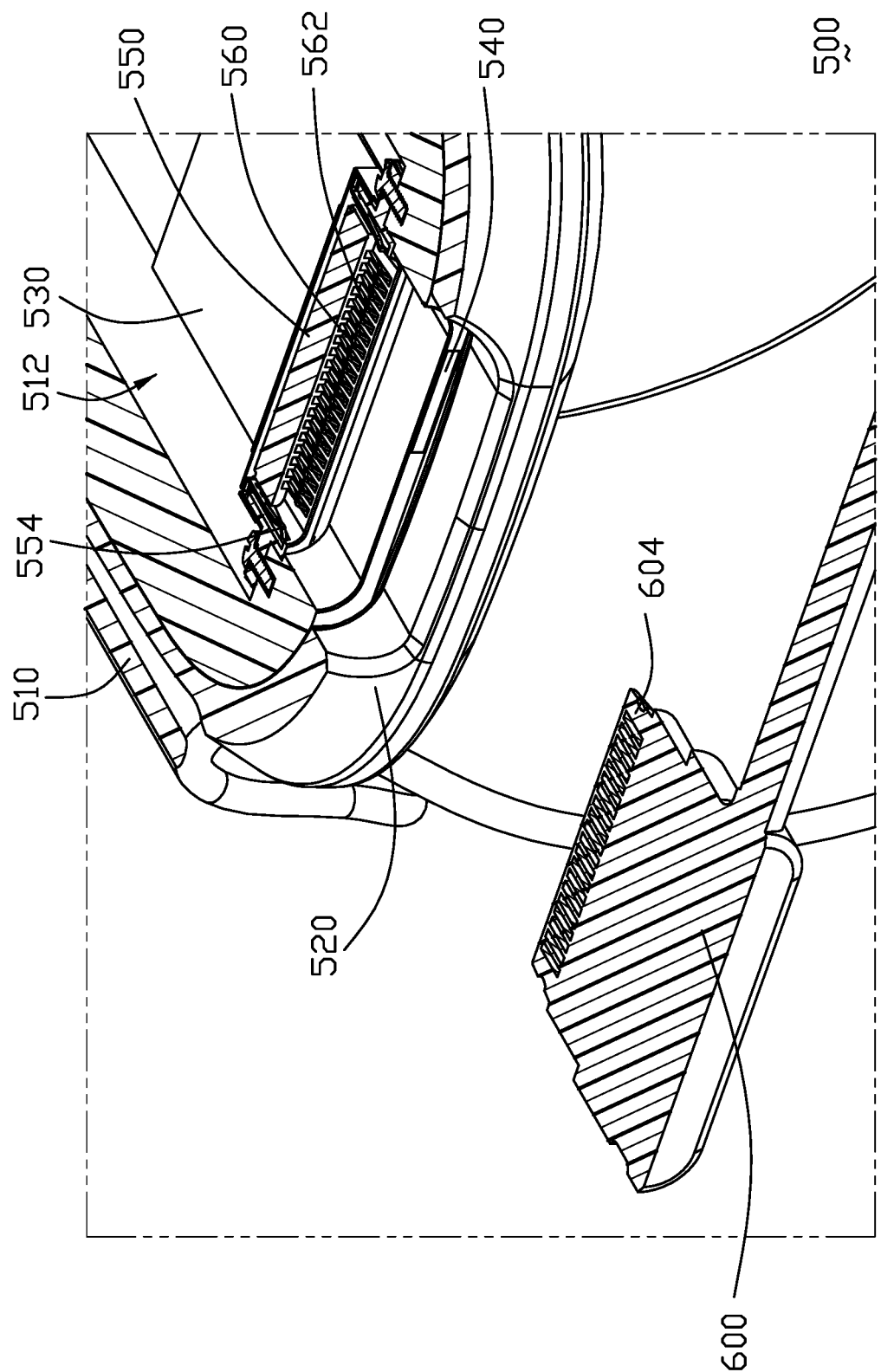
FIG. 5 is an enlarged cross-sectional perspective view of a portion of the electrical assembly of FIG. 1.
Figure 6:
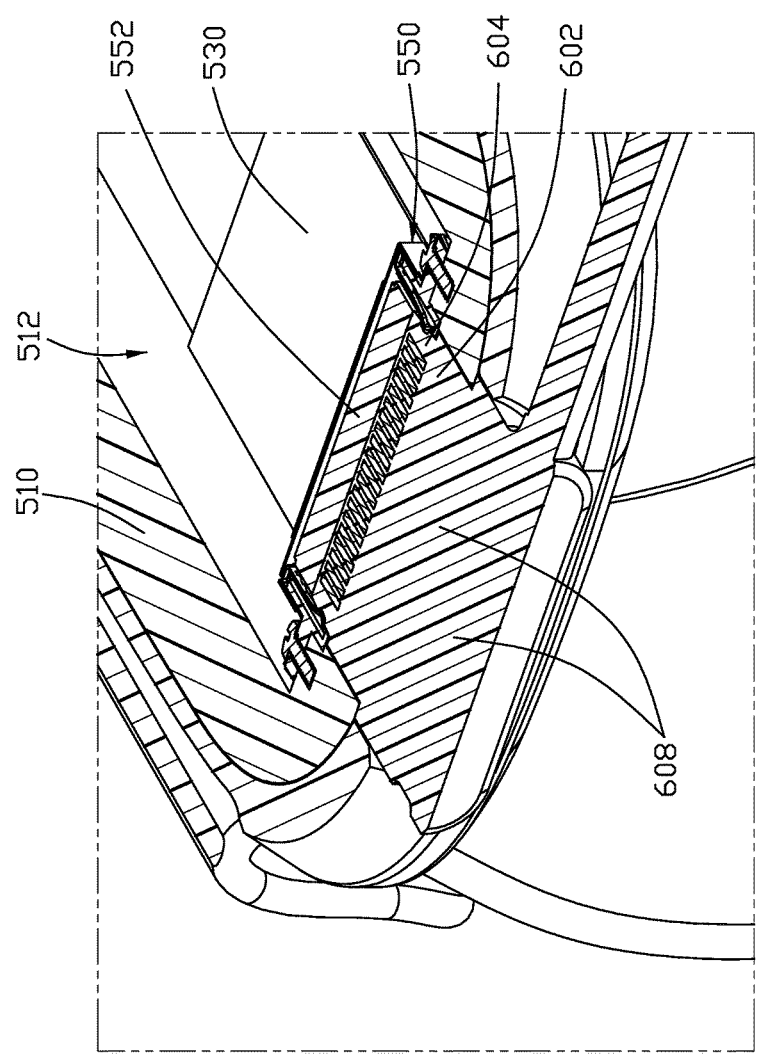
FIG. 6 is an enlarged cross-sectional perspective view of the portion of the electrical assembly of FIG. 5 in a mated state via one orientation.
Figure 7:
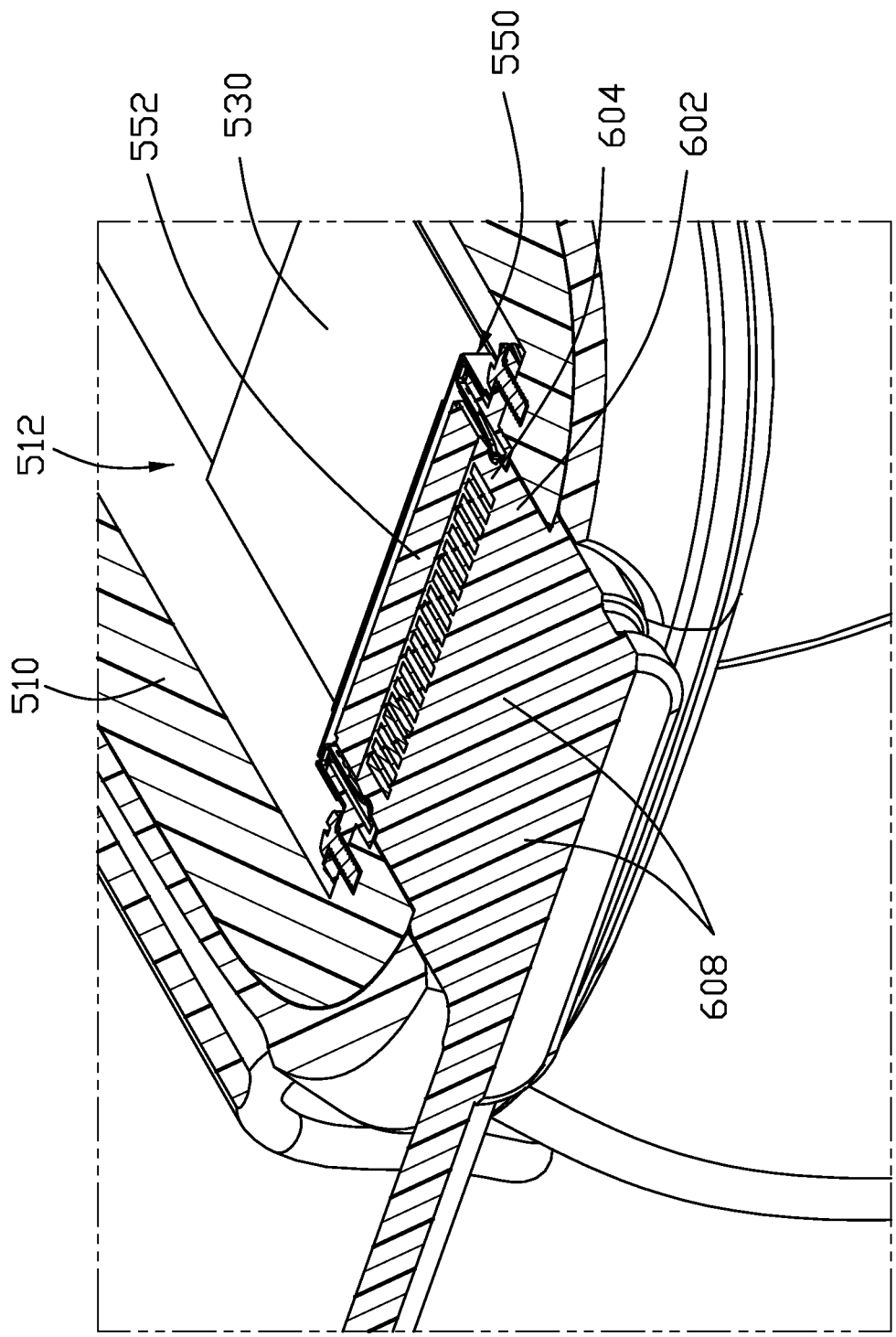
FIG. 7 is an enlarged cross-sectional perspective view of the portion of the electrical assembly of FIG. 6 in a meted state via another orientation.
Figure 8:
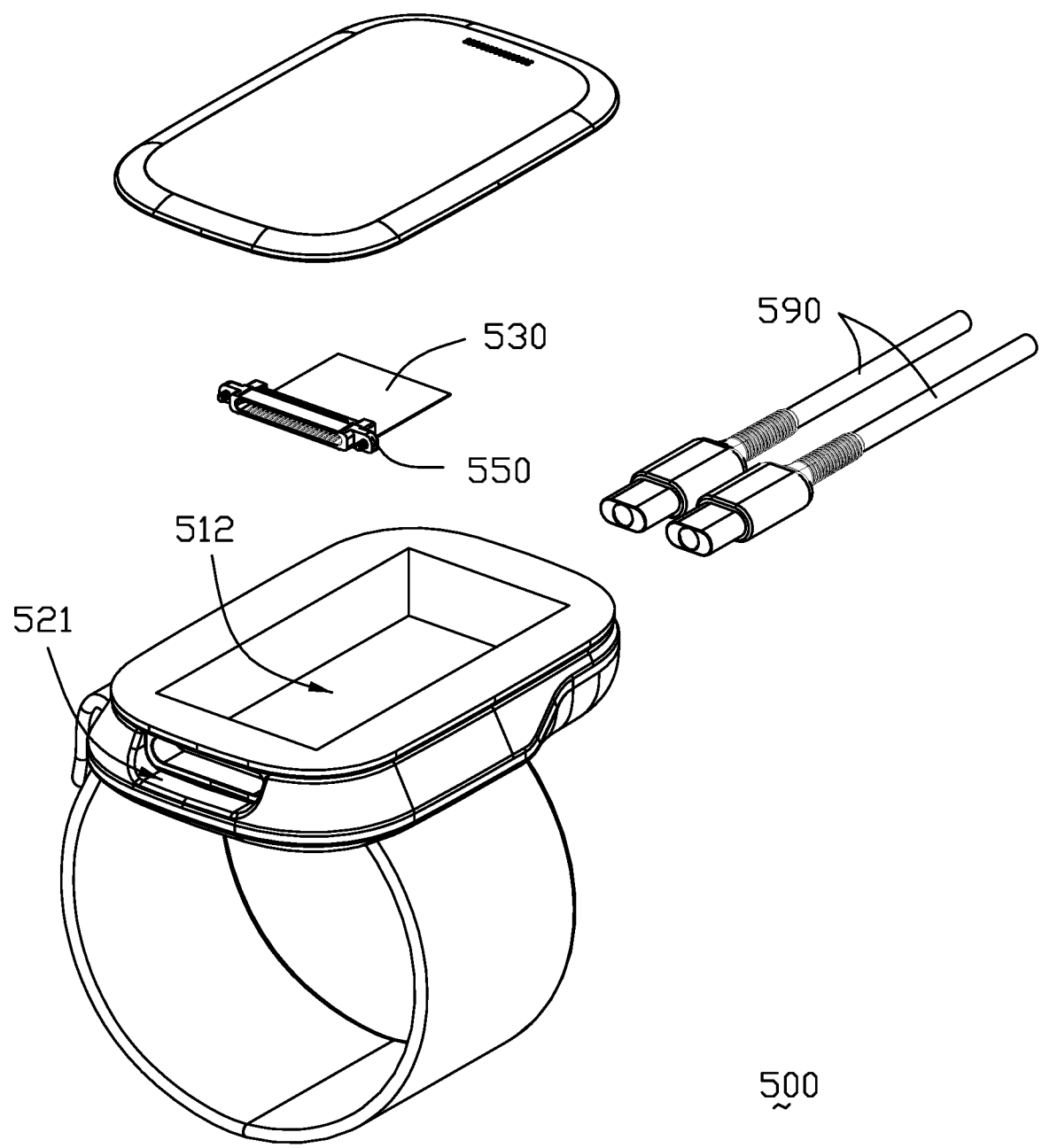
FIG. 8 is an exploded perspective view of the wearable device of FIG. 1.
Figure 9:
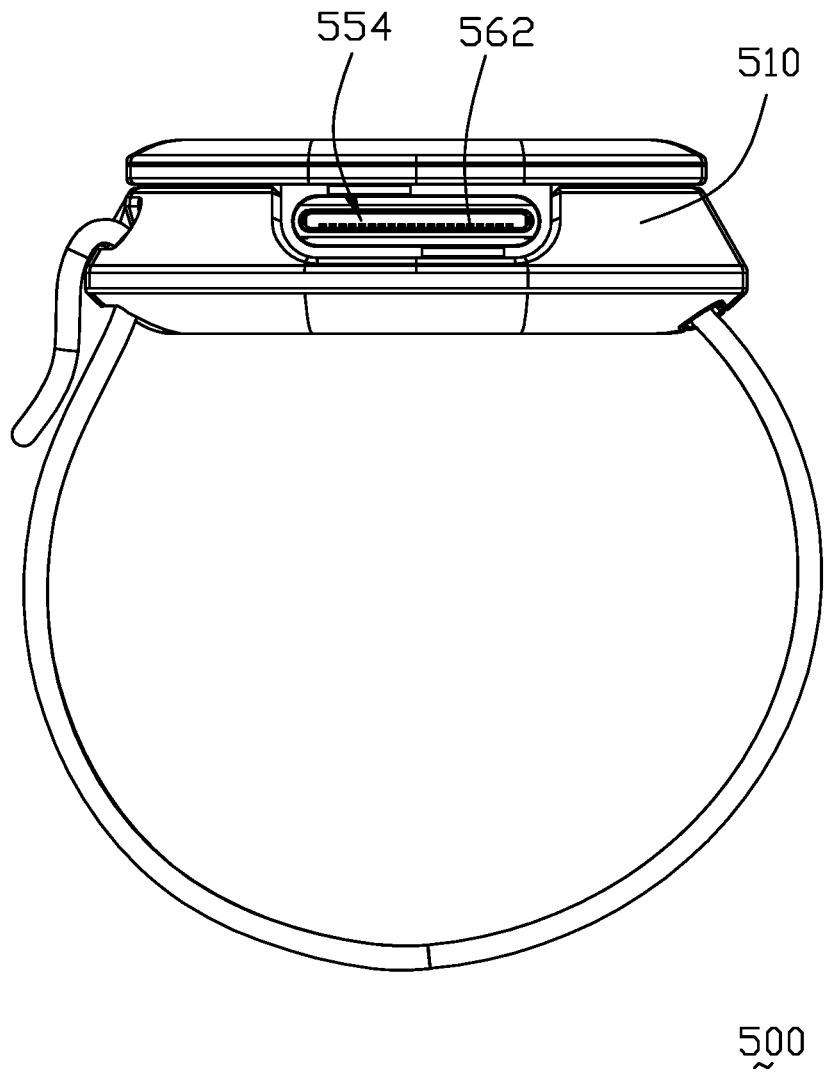
FIG. 9 is an elevational view of the wearable device of FIG. 1.
Figure 10:
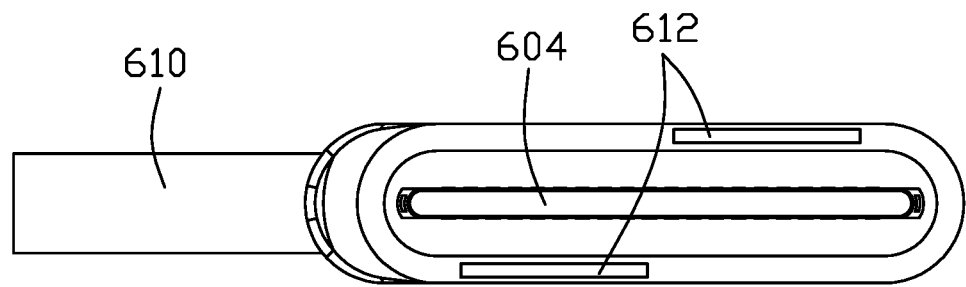
FIG. 10 is an elevational view of the cable connector of FIG. 1.
Figure 11:
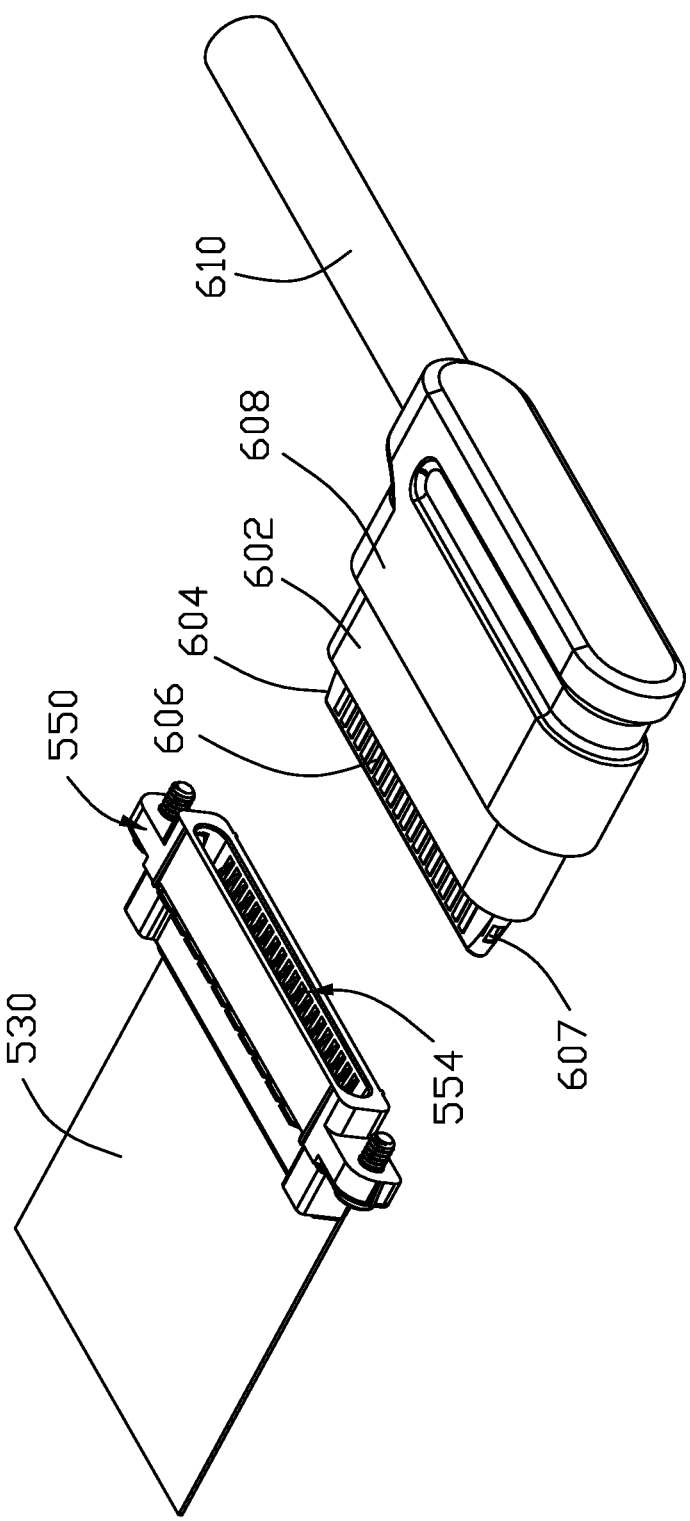
FIG. 11 is an exploded perspective view of the cable connector and the receptacle connector unit of the wearable device of FIG. 1 via an orientation.
Figure 12:
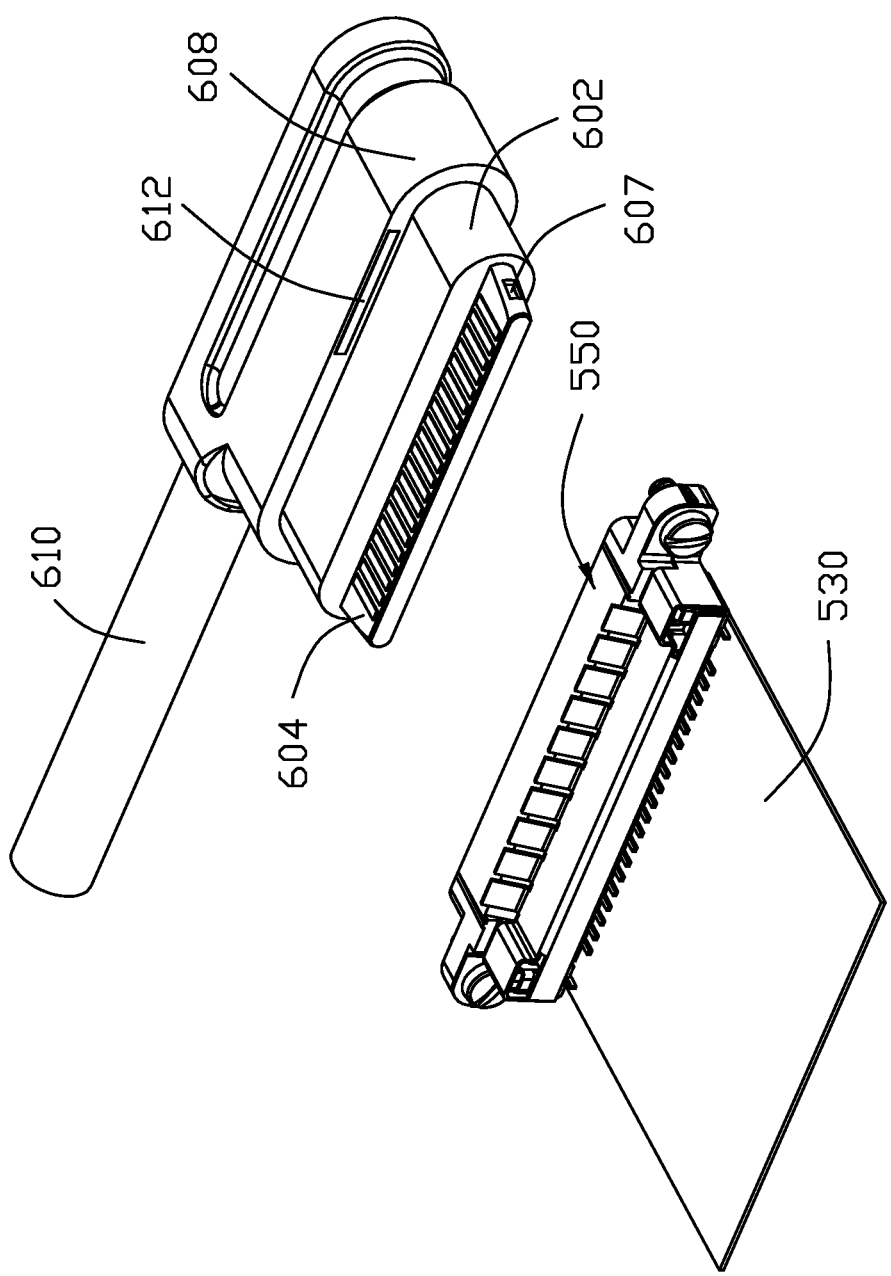
FIG. 12 is another exploded perspective view of the cable connector and the receptacle connector unit of the wearable device of FIG. 11.
Figure 13:
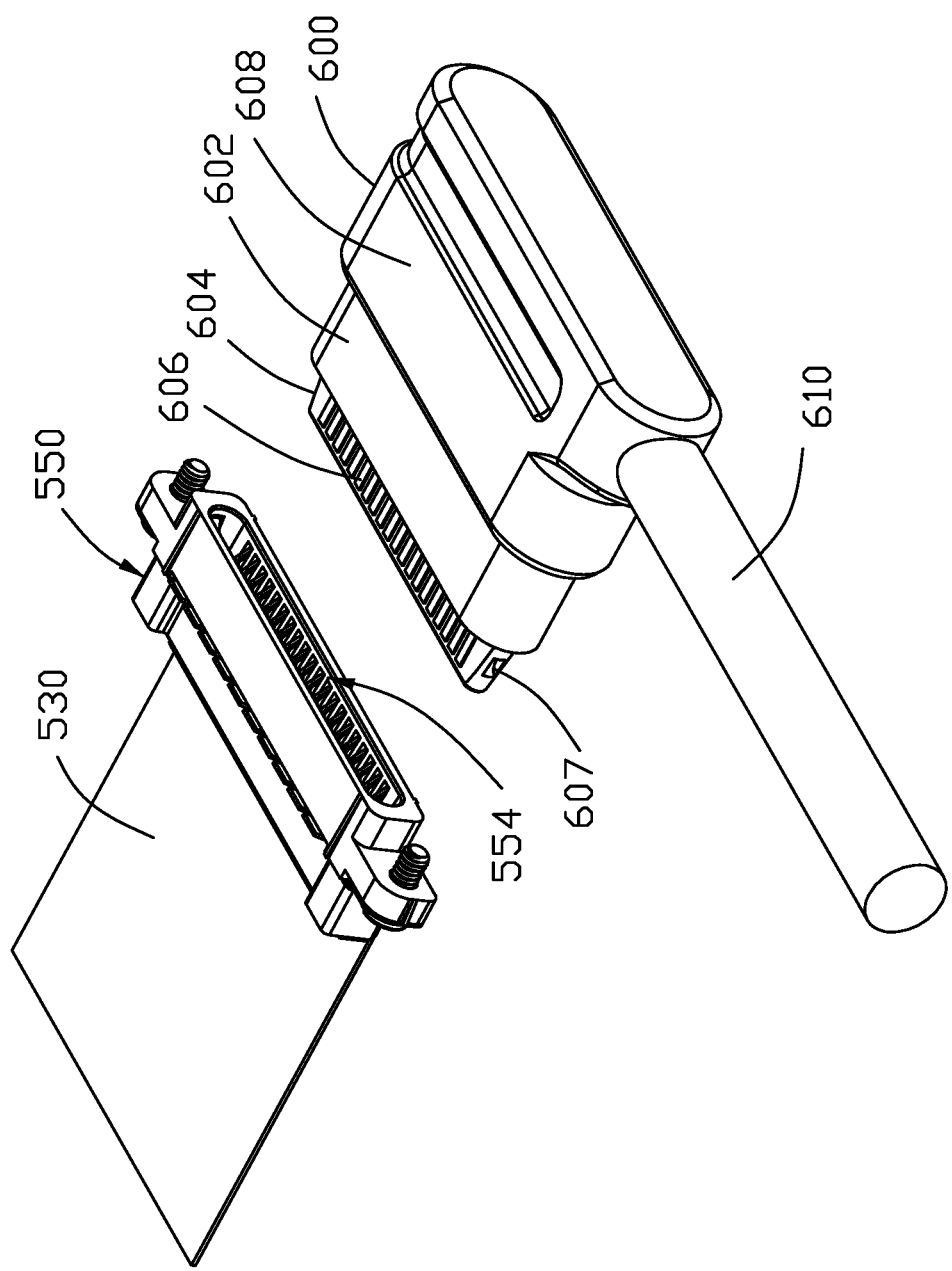
FIG. 13 is an exploded perspective view of the cable connector and receptacle connector unit of the wearable device of FIG. 11 via another orientation.
Figure 14:
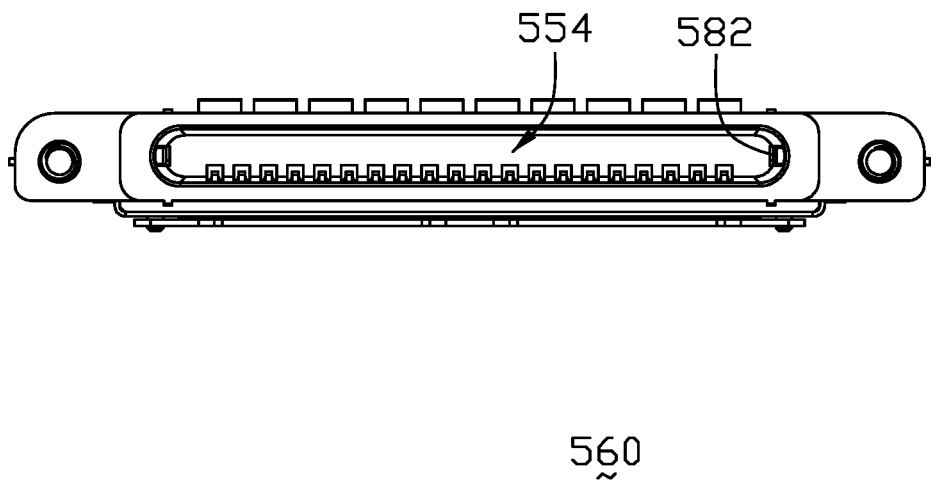
FIG. 14 is an elevational view of the receptacle connector unit of the wearable device of FIG. 1.
Figure 15:
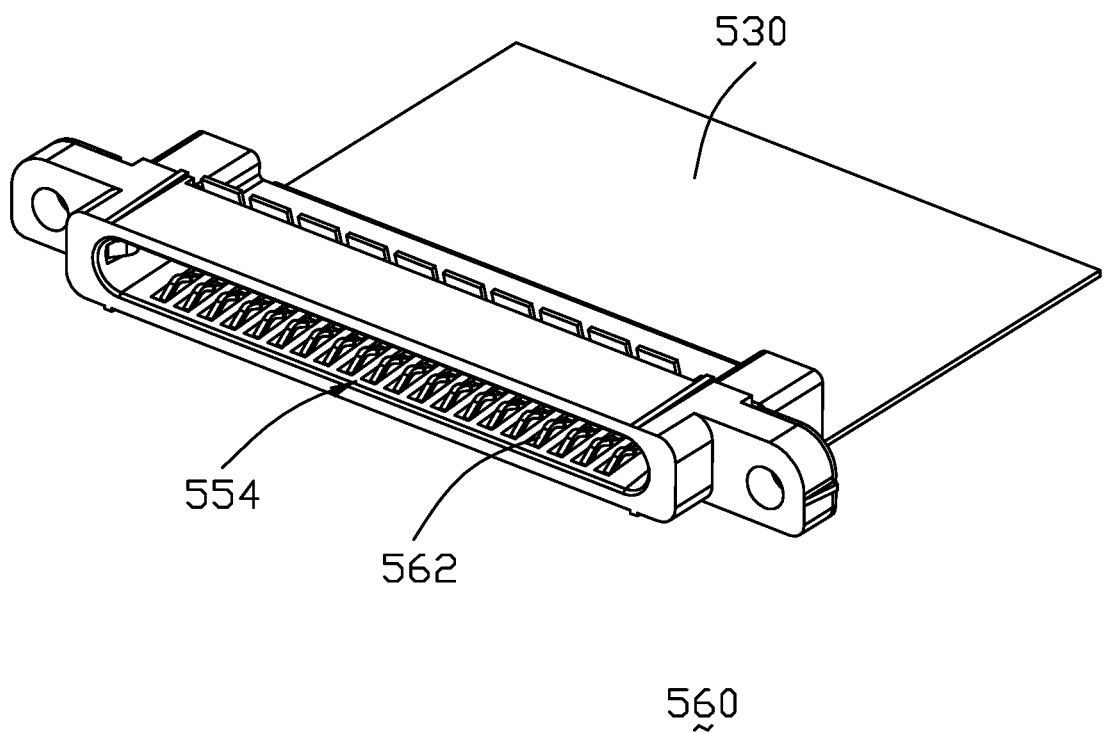
FIG. 15 is a perspective view of the receptacle connector unit of the wearable device of FIG. 1.
Figure 16:
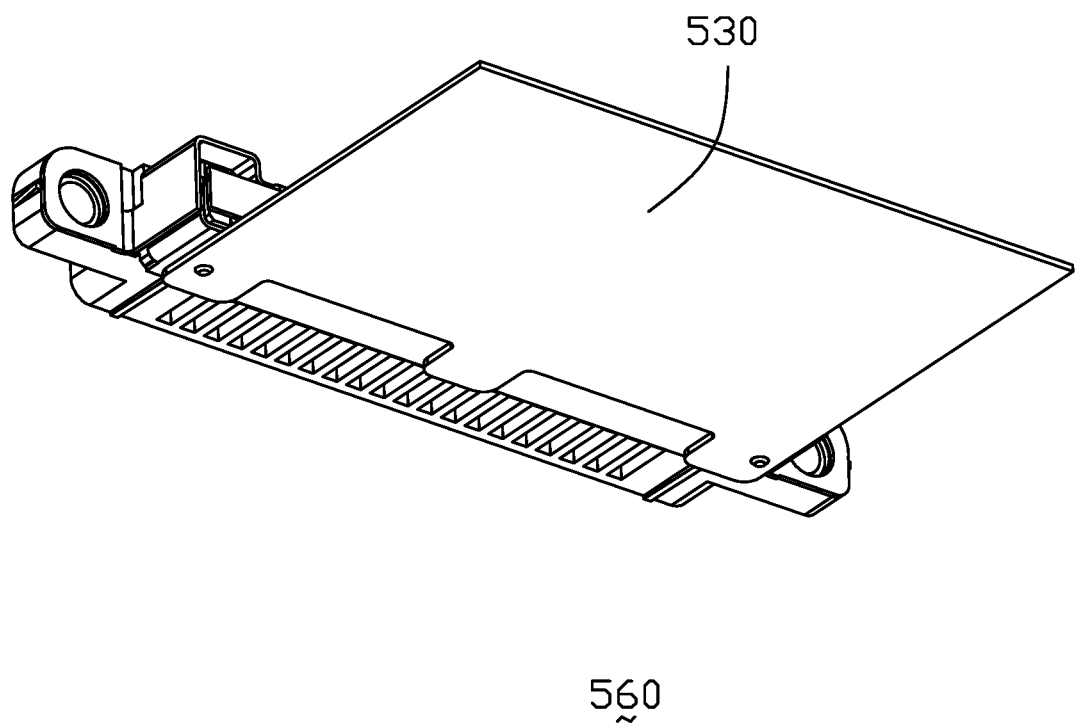
FIG. 16 is another perspective view of the receptacle connector unit of the wearable device of FIG. 15.
Figure 17:
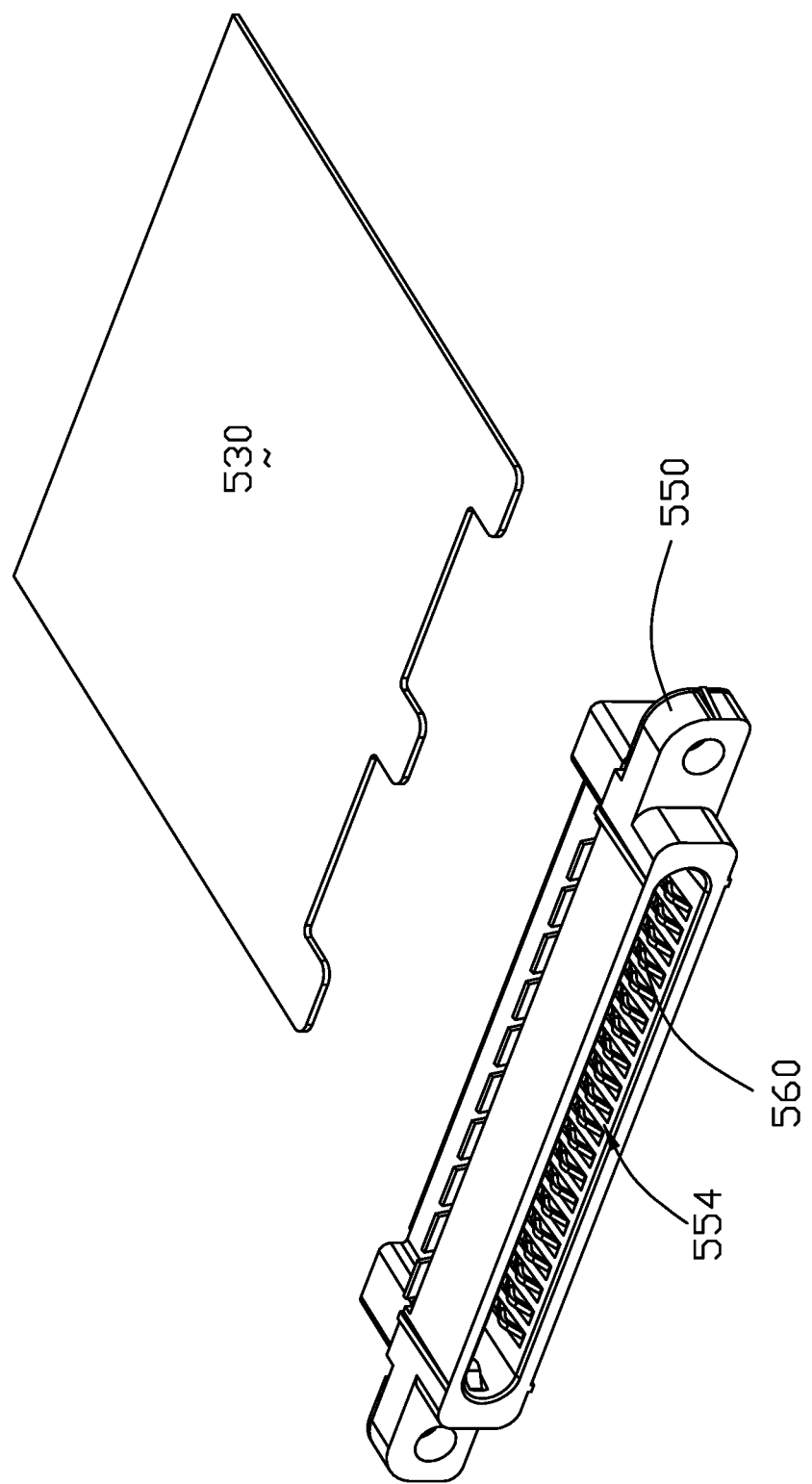
FIG. 17 is an exploded perspective view of the receptacle connector unit of the wearable device of FIG. 15.
Figure 18:
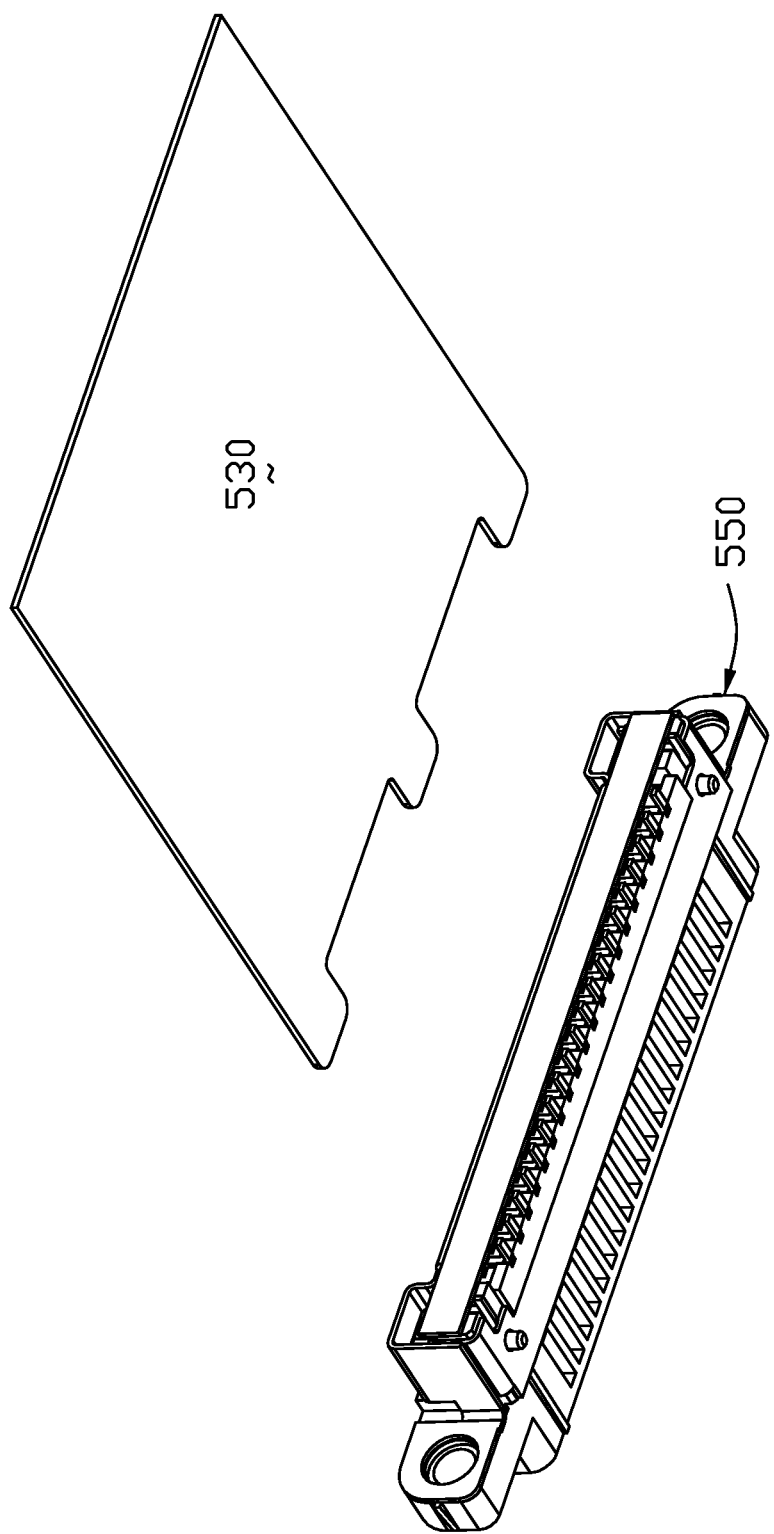
FIG. 18 is another exploded perspective view of the receptacle connector unit of the wearable device of FIG. 17.
Figure 19:
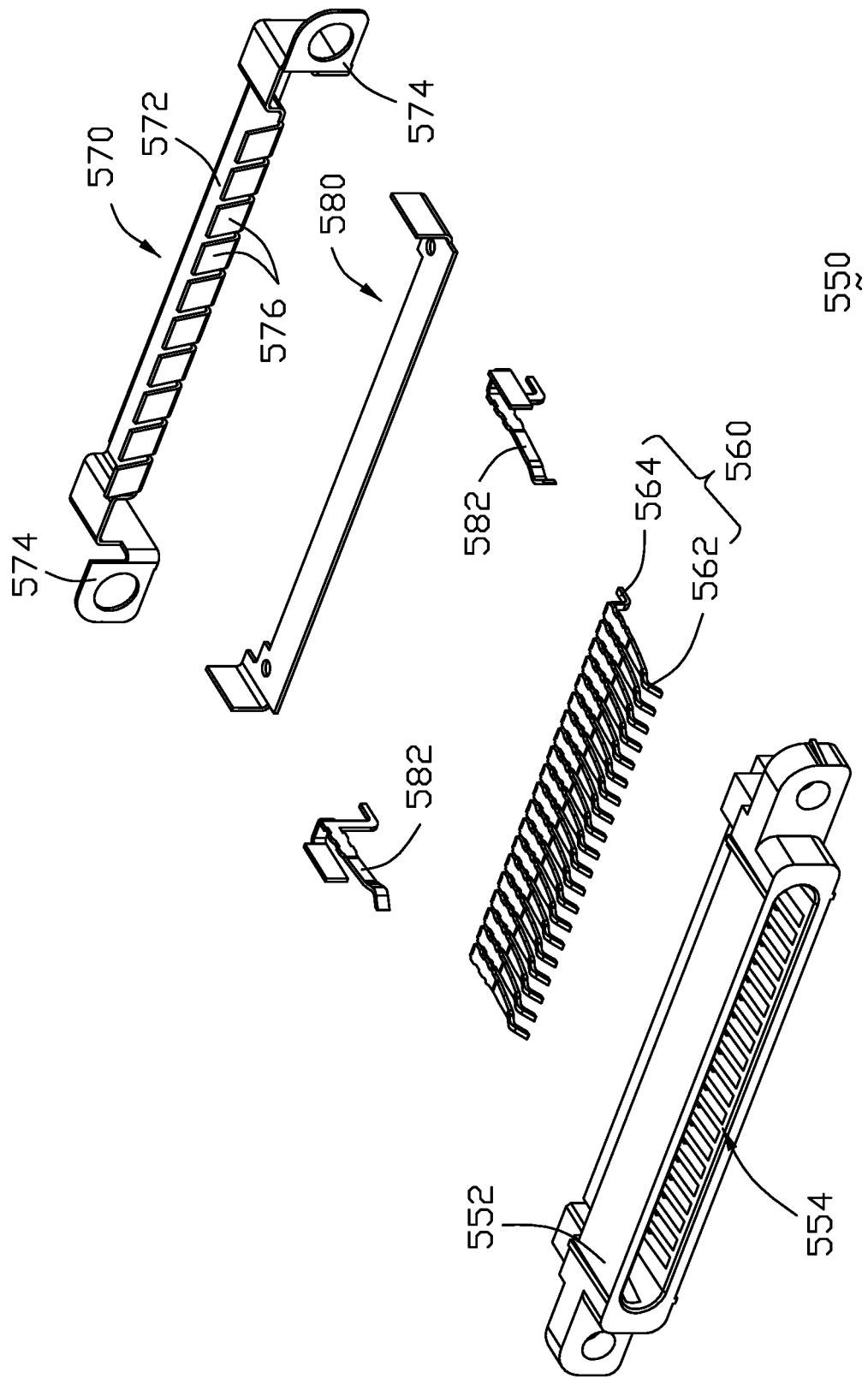
FIG. 19 is a further exploded perspective view of the receptacle connector unit of the wearable device of FIG. 17.
Figure 20:
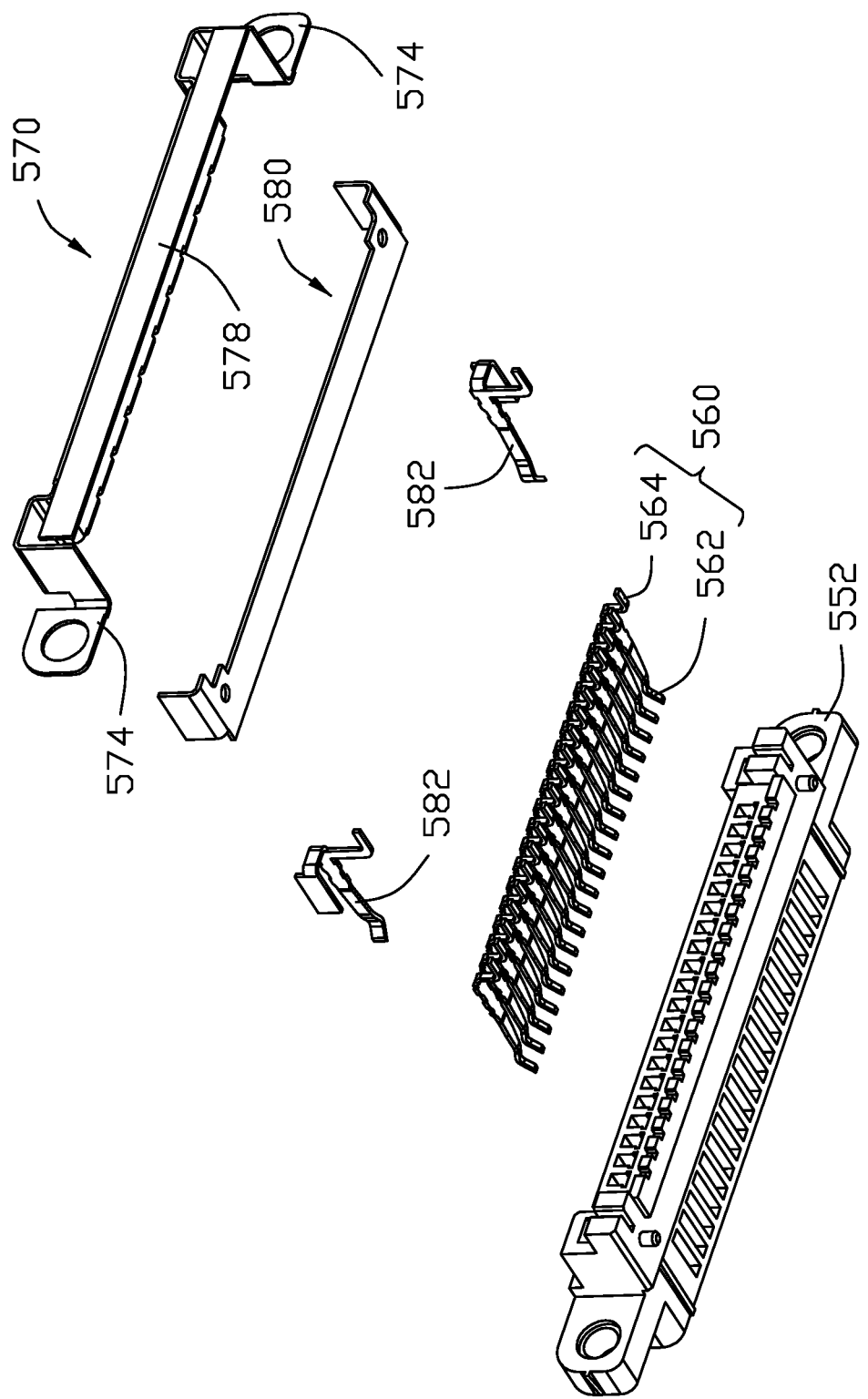
FIG. 20 is another exploded perspective view of the receptacle connector unit of the wearable device of FIG. 19.

FIGS. 1-20 show a wearable device 500 including a case 510 with an internal space 512 to receiving a printed circuit board 530 between opposite first and second ends 520, 522. A receptacle connector 550 is located around the first end 520, and includes an insulative housing 552 forming a receiving slot 554 therein. A row of receptacle contacts 560 are disposed by one side of the receiving slot 554 and have the corresponding contacting sections 562 exposed in the receiving slot 554 and the corresponding tail sections 564 soldered upon the printed circuit board 530. A metallic rear shell 570 is attached to the rear side of the housing 552 and includes a horizontal main body 572 and a pair of ears 574 at two opposite ends. A plurality of tabs 576 extend upwardly from a front edge of the main body 572. An elongated wall 578 extends from one ear 574 and is located below the horizontal main body 572. A metallic bottom shell 580 is attached on an underside of the housing 552. A pair of metallic spring latches 582 are assembled to the main body 572 adjacent to the pair of ears 574 to extend into the receiving slot 554. A pair of cables 590 electrically connected to the receptacle connector 550 via the printed circuit board 530, extend rearwardly through the second end 522. A pair of station magnets 540 are disposed in the case 510 behind the mating opening 521 at the first end 520 while in front of the receptacle connector 560.

A plug connector 600 is releasably mated with the receptacle connector 560, and includes a main base 602 with a mating tongue 604 extending forwardly therefrom and having corresponding contacting sections 606 exposed upon two opposite surfaces thereof. A pair of recesses 607 are formed in opposite lateral edges for engagement with the spring latches 582 of the receptacle connector 550. A holding part 608 is located behind the main body 602 with a cable 610 extending rearwardly therefrom. A pair of coupling magnets 612 are installed in the holding part 608.

Notably, the plug connector 600 can be inserted into the receptacle connector 560 through the mating opening 521 with the mating tongue 604 received within the receiving slot 554 in two orientations, i.e., in a flippable manner. The coupling magnets 612 are attractively coupled with the station magnets 540. Notably, the station magnets 540 are located at a position behind the mating opening 521 while in front of the receptacle connector 550, thus avoiding improper influence due to mating between the mating tongue 604 of the plug connector 600 and the receiving slot 554 of the receptacle connector 550, or the holding part 608 exposed outside of the mating opening 521. It should be noted that the dual orientation of the plug connector 600 for mating with the receptacle connector 560 is relatively important for the wearable device 500. It is because the wearable device 500 is adapted to be worn upon the arm of the user, and the cable 610 extends in the transverse direction with regard to the wearable device 500. Therefore, the user may decide which orientation of the plug connector 600 should be during mating with the receptacle connector 550 so as not to hinder the movement of the body, if the plug connector is required to be connected to the receptacle connector when the user is wearing the wearable device 500.

What is claimed is:

1. An electrical combination comprising:
a wearable electrical device including:
a case defining opposite first and second ends in a front-to-back direction;
a cable unit extending outwardly from the second end;
a receptacle connector disposed in the case around the first end and having an insulative housing defining a receiving slot, only one row of deflectable contacts retained in the housing along a transverse direction perpendicular to the front-to-back direction and exposed on one side of said receiving slot in a vertical direction perpendicular to both the front-to-back direction and the transverse direction;
a pair of station magnets disposed in the case in front of the receptacle connector; and
a plug connector including:
a main base having a mating tongue forwardly extending therefrom with two rows of contacting sections exposed upon two opposite surfaces of the mating tongue, a holding part located behind the mating base with a pair of coupling magnets therein, and a cable extending sidewardly from a rear portion of the holding part; whereby
the plug connector is able to be mated, along the front-to-back direction, with the receptacle connector in a flippable manner in the vertical direction via attractive retention between the coupling magnets and the station magnets in the front-to-back direction.

2. The electrical combination as claimed in claim 1, wherein in the vertical direction, the main base is thicker than the mating tongue, and the holding part is thicker than the main base.

3. The electrical combination as claimed in claim 2, wherein the holding part defines a stadium type cross-section having two long sides spaced from each other in the vertical direction, and each long side of the stadium type cross-section includes two halves in the transverse direction, and the pair of coupling magnets are respectively located at the corresponding halves of the two long sides, respectively, in a diagonal direction.

4. The electrical combination as claimed in claim 3, wherein the cable extends in the transverse direction from the holding part.

5. The electrical combination as claimed in claim 1, wherein along the front-to-back direction, the distance between the exposed station magnets and the receptacle connector is essentially equal to the dimension of the main base.

6. The electrical combination as claimed in claim 5, wherein the exposed station magnets are recessed from an exterior face of the first end of the case.

7. The electrical combination as claimed in claim 6, wherein along the front-to-back direction, a dimension of the holding part is larger than a distance between the exterior surface of the first end of the case and the exposed station magnets.

8. The electrical combination as claimed in claim 1, wherein the receptacle connector includes a metallic rear shell attached upon a rear side of the housing and having a horizontal main body with a pair of mounting ears at two opposite end in the transverse direction, and a plurality of tabs extending from a front edge of the main body in a vertical direction.

9. The electrical combination as claimed in claim 8, wherein the only one row of the deflectable contacts are located at a level below the tabs in the vertical direction.

10. An electrical connector assembly comprising:
a wearable device adapted to be put on an arm of a user and including:
a case defining opposite first and second ends in a front-to-back direction;
a receptacle connector disposed in the case around the first end and having an insulative housing defining a receiving slot, one row of contacts retained in the housing along a transverse direction perpendicular to the front-to-back direction and exposed on one side of said receiving slot in a vertical direction perpendicular to both the front-to-back direction and the transverse direction;
a pair of station magnets disposed in the case in front of the receptacle connector; and
a plug connector including:
a main base having a mating tongue forwardly extending therefrom with two rows of contacting sections exposed upon two opposite surfaces of the mating tongue, a holding part located behind the mating base with a pair of coupling magnets therein, and a cable extending rearward from the holding; whereby the plug connector is able to be mated with the receptacle connector in a flippable manner in the vertical direction via attractive retention between the coupling magnets and the station magnets in the front-to-back direction.

11. The electrical combination as claimed in claim 10, wherein in the vertical direction, the main base is thicker than the mating tongue, and the holding part is thicker than the main base.

12. The electrical combination as claimed in claim 11, wherein the holding part defines a stadium type cross-section having two long sides spaced from each other in the vertical direction, and each long side of the stadium type cross-section includes two halves in the transverse direction, and the pair of coupling magnets are respectively located at the corresponding halves of the two long sides, respectively, in a diagonal direction.

13. The electrical combination as claimed in claim 12, wherein the cable extends in the transverse direction from the holding part.

14. The electrical combination as claimed in claim 10, wherein along the front-to-back direction, the distance between the exposed station magnets and the receptacle connector is essentially equal to the dimension of the main base.

15. The electrical combination as claimed in claim 14, wherein the exposed station magnets are recessed from an exterior face of the first end of the case.

16. The electrical combination as claimed in claim 15, wherein along the front-to-back direction, a dimension of the holding part is larger than a distance between the exterior surface of the first end of the case and the exposed station magnets.

17. The electrical combination as claimed in claim 10, wherein the receptacle connector includes a metallic rear shell attached upon a rear side of the housing and having a horizontal main body with a pair of mounting ears at two opposite end in the transverse direction, and a plurality of tabs extending from a front edge of the main body in a vertical direction.

18. The electrical combination as claimed in claim 17, wherein the receptacle connector only has said row of the deflectable contacts without other contacts therein, and said row of the deflectable contacts are located at a level below the tabs in the vertical direction.

\* \* \* \* \*